US011239412B2

(12) United States Patent
Chen et al.

(10) Patent No.: US 11,239,412 B2
(45) Date of Patent: Feb. 1, 2022

(54) SEMICONDUCTOR STRUCTURE

(71) Applicant: UNITED MICROELECTRONICS CORP., Hsinchu (TW)

(72) Inventors: Yu-Chun Chen, Kaohsiung (TW); Ya-Sheng Feng, Tainan (TW); Chiu-Jung Chiu, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/686,272

(22) Filed: Nov. 18, 2019

(65) Prior Publication Data

US 2021/0119111 A1  Apr. 22, 2021

(30) Foreign Application Priority Data

Oct. 16, 2019  (CN) .......................... 201910982171.1

(51) Int. Cl.
*H01L 43/02* (2006.01)
*H01L 43/12* (2006.01)

(52) U.S. Cl.
CPC .............. *H01L 43/02* (2013.01); *H01L 43/12* (2013.01)

(58) Field of Classification Search
CPC ....... H01L 43/02; H01L 43/12; H01L 27/222; H01L 21/3213
See application file for complete search history.

(56) References Cited

U.S. PATENT DOCUMENTS

| 6,801,415 | B2 | 10/2004 | Slaughter et al. |
| 7,473,951 | B2 | 1/2009 | Kim et al. |
| 7,791,844 | B2 | 9/2010 | Carey et al. |
| 9,460,768 | B2 | 10/2016 | Manipatruni et al. |
| 9,515,252 | B1 * | 12/2016 | Annunziata ........... H01L 27/222 |
| 9,780,301 | B1 | 10/2017 | Chuang et al. |
| 9,818,935 | B2 * | 11/2017 | Chuang ................... H01L 43/12 |
| 9,905,282 | B1 * | 2/2018 | Yi .......................... H01F 41/303 |
| 10,355,198 | B2 * | 7/2019 | Liao ........................ H01L 43/08 |
| 10,727,274 | B2 * | 7/2020 | Chen ....................... H01F 41/32 |
| 10,833,258 | B1 * | 11/2020 | Dutta .................... H01L 27/228 |
| 2013/0015540 | A1 | 1/2013 | Choi |
| 2013/0267042 | A1 * | 10/2013 | Satoh .................... H01L 27/222 438/3 |
| 2015/0263267 | A1 | 9/2015 | Kanaya |
| 2016/0005923 | A1 * | 1/2016 | Suzuki ................... H01L 33/32 257/98 |
| 2017/0186944 | A1 * | 6/2017 | Annunziata ............. H01L 43/12 |
| 2018/0166501 | A1 * | 6/2018 | Chuang .................. H01L 43/08 |
| 2018/0374895 | A1 * | 12/2018 | Hsu ........................ H01L 43/12 |
| 2019/0013353 | A1 | 1/2019 | Lee et al. |

(Continued)

FOREIGN PATENT DOCUMENTS

JP         6624356 B1    12/2019

OTHER PUBLICATIONS

Thiam et al., "Patterning challenges for beyond 3 nm logic devices: example of an interconnected magnetic tunnel junction", Proc. of SPIE Advanced Lithography, Mar. 2019 (Year: 2019).*

(Continued)

*Primary Examiner* — Bilkis Jahan
*Assistant Examiner* — Victor V Barzykin
(74) *Attorney, Agent, or Firm* — WPAT, PC

(57) ABSTRACT

A semiconductor structure includes an electrode element with an upper surface. The upper surface includes at least one convex curved portion.

18 Claims, 3 Drawing Sheets

(56) References Cited

U.S. PATENT DOCUMENTS

| | | | |
|---|---|---|---|
| 2019/0164584 A1* | 5/2019 | Chuang | H01L 27/222 |
| 2019/0165259 A1* | 5/2019 | Liao | H01L 43/12 |
| 2019/0252576 A1 | 8/2019 | Lee et al. | |
| 2020/0006641 A1* | 1/2020 | Liou | H01L 43/10 |
| 2020/0127047 A1* | 4/2020 | Chen | H01L 43/08 |
| 2020/0350495 A1* | 11/2020 | Dutta | H01L 43/10 |

OTHER PUBLICATIONS

Machine translation of JP6624356B1 (Year: 2021).*
European Patent Office "Search Report" dated Aug. 7, 2020, EPO.

* cited by examiner

SEMICONDUCTOR STRUCTURE

This application claims the benefit of People's Republic of China application Serial No. 201910982171.1, filed Oct. 16, 2019, the subject matter of which is incorporated herein by reference.

FIELD OF THE INVENTION

The present disclosure relates to a semiconductor structure, and more particularly to a semiconductor structure with an electrode element.

DESCRIPTION OF THE RELATED ART

With development of the semiconductor technology, semiconductor devices have become smaller in size. In the semiconductor technology, shrinking of feature sizes, and improving operation speed, efficiency, density, and cost per Integrated circuit are important objectives. For satisfy customer need and the market demand, it is important to shrink devices in size and also to maintain the electricity of devices. However, as devices shrink in size, the risk of undesirable damage to layers and elements in devices during the manufacturing process is increased, which results in considerable negative effects upon electrical performance of devices. As such, how to prevent damage to layers and elements in devices has become an issue. Generally, in order to produce semiconductor devices with good electrical performance, profiles of elements in devices should be in complete shape.

The manufacturing process of semiconductor structure usually includes forming several materials on a substrate and removing the materials afterwards. Ion beam etching (IBE) process is one of the methods used to remove the materials formed on the substrate. Ion beam etching process is a dry etching technique where ions are accelerated toward the surface of the target material. Through interactions between ions and target material, the target material is removed completely or partially to have a predetermined height.

However, ion beam etching process depends on a critical dimension (CD) of an element in existing technology, that is, elements having different critical dimensions may have different heights after applying an ion beam etching process. Particularly, applying an ion beam etching process to an element having a critical dimension more than 100 nm will result in considerable remaining of material to be removed, which also known as the problem of under etching.

Take electrode elements in semiconductor structures as an example, manufacturing process usually includes applying an etching process to electrode elements, and then forming conductive structures, such as vias and metal layers, around the electrode elements. Once the problem of under etching occurs in the etching process, the heights of the electrode elements after the etching process may be higher than the predetermined height, which causes problems in subsequent processes. For example, dielectric layers may remain, and conductive structures may be unable to form in correct positions in subsequent processes. As a result, an open risk occurs in semiconductor structures. In other words, the problem of under etching may lead to insufficient process window.

SUMMARY OF THE INVENTION

According to an embodiment of the present disclosure, a semiconductor structure is provided. The semiconductor structure includes an electrode element. The electrode element has an upper surface. The upper surface includes at least one convex curved portion.

The disclosure will become apparent from the following detailed description of the preferred but non-limiting embodiments. The following description is made with reference to the accompanying drawings.

DETAILED DESCRIPTION OF THE INVENTION

Figure 1:
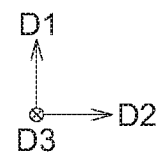
FIG. 1 illustrates a schematic sectional view of an electrode element according to one embodiment of the present disclosure.
Figure 1:
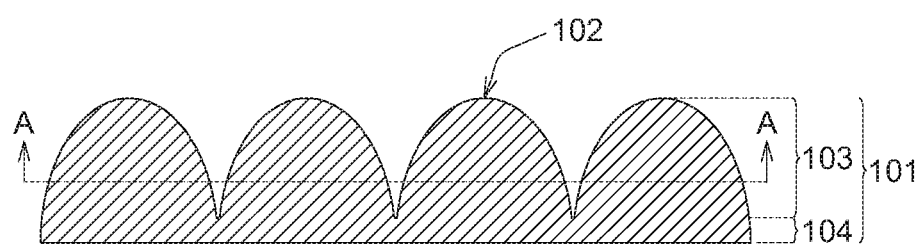

According to the embodiments of the present disclosure, a semiconductor structure is provided. The embodiments are described in details with reference to the accompanying drawings. The details of the embodiments are for exemplification only, not for limiting the scope of protection of the disclosure. Moreover, the identical or similar elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regarded as an illustrative sense rather than a restrictive sense. It is to be noted that the drawings are simplified for clearly describing the embodiments, and the details of the structures of the embodiments are for exemplification only, not for limiting the scope of protection of the disclosure. Ones having ordinary skills in the art may modify or change the structures according to the embodiments of the present disclosure.

FIG. 1 illustrates a schematic sectional view of an electrode element according to one embodiment of the present disclosure. As shown in FIG. 1, the electrode element 101 has an upper surface 102, and the upper surface 102 includes at least one convex curved portion. In one embodiment, the electrode element 101 may include a lower electrode portion 104 and an upper electrode portion 103. The upper electrode portion 103 may have convex structures sticking out from the lower electrode portion 104 in an upward direction (a first direction D1, e.g. a vertical direction or a z-direction). The upper electrode portion 103 has the upper surface 102. The convex structures may have a varied height showing a decrease from the center of each convex structure toward two opposite sides in height. The upper surfaces of the convex structures may be understood as the convex curved portion of the upper surface 102. The maximum height of the upper electrode portion 103 having the convex structures (which may be understood as a height along a central line of each convex structure in the first direction D1 of the upper electrode portion 103) may be, but not limited to, 90 nm to 95 nm. The height of the lower electrode portion 104 may be defined as a distance between a lower surface of the electrode element 101 and the lowest area between two adjacent convex structures. The lower electrode portion 104 may have a substantial uniform height. For example, the lower electrode portion 104 may have a height of 15 nm to 19 nm.

In one embodiment, the formation of the electrode element 101 may include: forming a conductive film through a proper deposition process; patterning the conductive film through a photo lithography etching process to form a conductive lump with a flat upper surface; and applying an ion beam etching process to the conductive lump to remove partial material of the conductive lump from the flat upper surface. The ion beam etching process is stopped at an etch-stop line, and an etch depth of the ion beam etching process, defined as a distance between the flat upper surface and the etch-stop line in the first direction D1, is less than the thickness (a dimension in the first direction D1) of the conductive lump. As a result, the upper part of the conductive lump above the etch-stop line is removed partially to form the upper electrode portion 103, and the lower part of the conductive lump below the etch-stop line, to which the ion beam etching process is not applied, is defined as the lower electrode portion 104. The upper electrode portion 103 and the lower electrode portion 104 may include the same conductive material, such as tantalum (Ta), copper (Cu) or any other proper materials.

Figure 2:
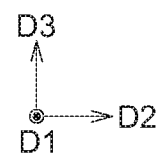
FIG. 2 illustrates a schematic sectional view of an electrode element according to one embodiment of the present disclosure.
Figure 2:
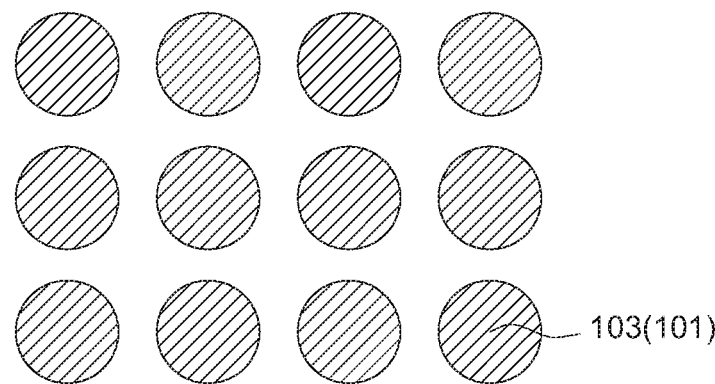

In one embodiment, the upper electrode portion 103 may include a moth eye structure that tapers from the bottom plane section to the top plane section. Specifically, the bottom plane section and the top plane section of the moth eye structure are areas in a plane defined by a second direction D2 and a third direction D3 (e.g. x-y plane), and the moth eye structure tapers in the first direction D1 (e.g. z-direction). The upper surface 102 of the electrode element 101 may be understood as the upper surface 102 of the upper electrode portion 103 having the moth eye structure. The convex curved portion of the upper surface 102 may have convex curved portions with hemisphere shapes or hemi-ellipsoid shapes arranged continuously. In one embodiment, the upper electrode portion 103 having the moth eye structure may have an arrangement that shows convex curved portions in rows and columns. FIG. 2 shows a sectional view of an electrode element taken along the cross-sectional line AA shown in FIG. 1. However, the arrangement of the upper electrode portion 103 is not limited to the disclosure above. The upper electrode portion 103 may have other proper pattern, such as a mesh pattern.

Figure 3:
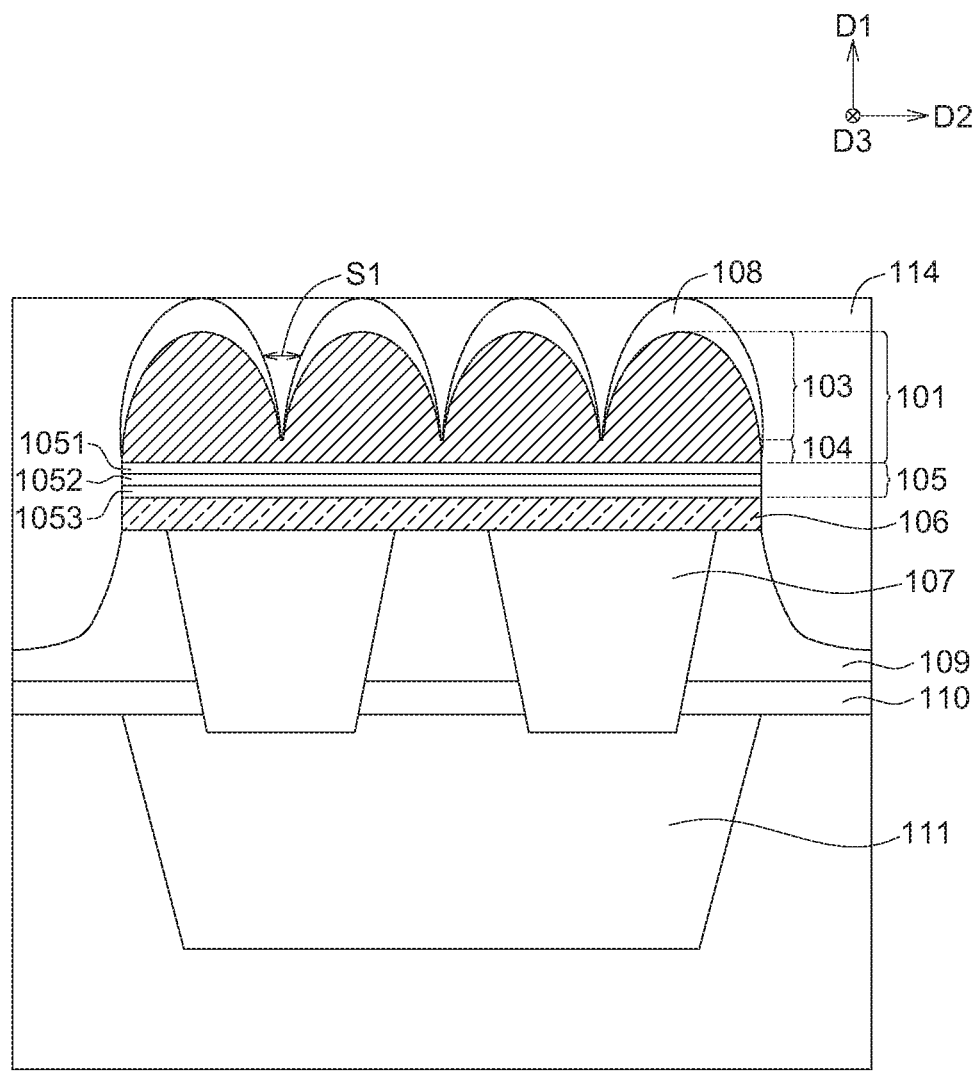
FIG. 3 illustrates a schematic sectional view of a semiconductor structure according to one embodiment of the present disclosure.

The electrode element 101 provided in the present disclosure may be used widely in different semiconductor structures. For example, the electrode element 101 may be used in a semiconductor structure shown in FIG. 3. FIG. 3 illustrates a schematic sectional view of the semiconductor structure according to one embodiment of the present disclosure. In one embodiment, the electrode element 101 may be used as an electrode for a magnetic tunnel junction (MTJ) structure 105. The MTJ structure 105 may include a composite structure formed by a plurality of layers. The layers may include at least a first magnetic layer 1051, a second magnetic layer 1053, and an insulating layer 1052 formed between the first magnetic layer 1051 and the second magnetic layer 1053. In one embodiment, as shown in FIG. 3, the electrode element 101 may be formed on the MTJ structure 105, and the MTJ structure may be formed on a bottom electrode 106. The MTJ structure 105 is electrically connected between the electrode element 101 and the bottom electrode 106. The bottom electrode 106 is formed on via elements 107. The via elements 107 are separated from each other. In this embodiment, the electrode element 101 is used as a top electrode for the MTJ structure 105. The directions of magnetization of the first magnetic layer 1051 and the second magnetic layer 1053 of the MTJ structure 105 may be switched individually as current passes through the MTJ structure 105 through the top electrode and the bottom electrode 106. The electrical resistance of the MTJ structure 105 changes due to the relative orientation of the directions of magnetization of the first magnetic layer 1051 and the second magnetic layer 1053. Consequently, the MTJ structure 105 may be switched between different states of electrical resistance. Different states of electrical resistance may represent different operation mode of the MTJ structure 105. For example, a low resistance state may be considered to mean "1", while a high resistance state may be considered to mean "0". The insulating layer 1052 of the MTJ structure 105 may include an oxide, specifically an oxide of metal. For example, the insulating layer 1052 of the MTJ structure 105 may include magnesium oxide (MgO) or any other proper materials. The first magnetic layer 1051 and the second magnetic layer 1053 of the MTJ structure 105 may include metals, such as nickel (Ni), iron (Fe), cobalt (Co), or the combination thereof, or any other proper materials. The bottom electrode 106 may include conductive materials, such as tantalum (Ta), copper (Cu) or any other proper materials. Specifically, the bottom electrode 106 may include tantalum nitride (TaN).

As shown in FIG. 3, via elements 107 are disposed on the conductive layer 111 through a dielectric element 110. The dielectric element 110 is disposed on the conductive layer 111. The conductive layer 111 may be a metal layer, such as a Metal 2 (M2) layer. Further, the semiconductor structure may include a dielectric layer 109 formed on the dielectric element 110 and on a sidewall of the via elements 107. In one embodiment, the semiconductor structure may include a hard mask layer 108 formed on the electrode element 101. The hard mask layer 108 may include an oxide, such as silicon oxide. The hard mask layer 108 may include a nitride, such as silicon nitride. The hard mask layer 108 may include any other proper dielectric materials or materials suitable for a hard mask. For example, the formation of the hard mask layer 108 may include forming a thin film conformally covering the electrode element 101 through a proper deposition process and applying an ion beam etching process to the thin film to form the profile shown in FIG. 3. In one embodiment, the thin film formed through a deposition process may have a substantial uniform thickness, such as, but not limited to, a thickness of 20 nm to 26 nm. As shown in FIG. 3, the thickness of the hard mask layer 108 on the convex structures of the upper electrode portion 103 has a profile gradually decreasing from the center of the hard mask layer 108 toward two opposite sides of the hard mask layer 108. The hard mask layer 108 covers the upper surface 102 of the electrode element 101 and may further cover a sidewall of the lower electrode portion 104. In one embodiment, the hard mask layer 108 is formed on the electrode element 101 and a sidewall of the MTJ structure 105. In one embodiment, the profile of the dielectric layer 109 is formed through an ion beam etching process, and the hard mask layer 108 may prevent the electrode element 101 from being damaged by the ion beam etching process. In one embodiment, the semiconductor structure may include a dielectric film 114 formed on the dielectric layer 109, the MTJ structure 105, the electrode element 101 and the hard mask layer 108.

The height of the electrode element 101 may be controlled accurately through an ion beam etching process. For example, a difference in height between any two of convex structures of the upper electrode portion 103, also understood as a difference in the maximum height between of any two of convex structures, may be approximately less than 50 Angstrom (Å). Alternatively, the electrode element 101 may have a height which a difference in height between the electrode element 101 and a conductive element in other region formed by the same conductive film as the electrode element 101 is less than 50 Å. In some embodiments, the accurate control to the height of the electrode element 101 may prevent a loading effect problem during a chemical-mechanical polishing process applied to the dielectric film 114, and improve the process windows of the subsequent processes. For example, a via element and a Metal 3 layer formed subsequently on a Metal 2 layer in other region may have a reliable electrical connection with the Metal 2 layer, which prevents a problem of broken circuit. As a result, the yield of the product is improved.

Figure 4:
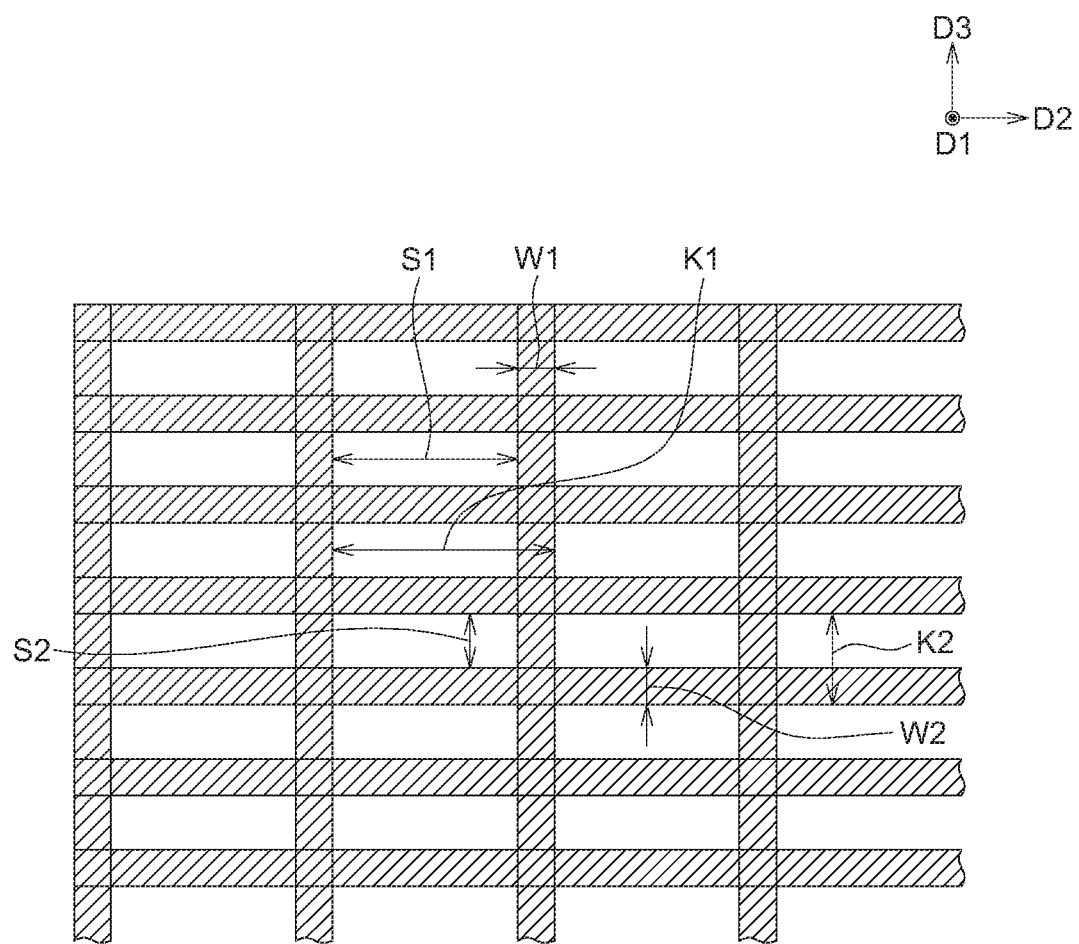
FIG. 4 illustrates an exemplary layout for an ion beam etching process according to one embodiment of the present disclosure.

In one embodiment, ion beam etching process is performed according the layout shown in FIG. 4. The layout may include a space S1 in the second direction D2, a dimension W1 in the second direction D2 (such as a width), a pitch K1 in the second direction D2, a space S2 in the third direction D3, a dimension W2 in the third direction D3 (such as a width), and a pitch K2 in the third direction D3. In one embodiment, the layout may be stored in a GDS format. The pitch K1 is the sum of the space S1 and the dimension W1. The pitch K2 is the sum of the space S2 and the dimension W2. In one embodiment, in the grid layout, the ratio of the pitch K1 to the pitch K2 is 1.5:1, for example, the pitch K1 is 315 nm and the pitch K2 is 210 nm. In another embodiment, in the grid layout, the ratio of the pitch K1 to the pitch K2 is 2:1, for example, the pitch K1 is 420 nm and the pitch K2 is 210 nm. In yet another embodiment, in the grid layout, the ratio of the pitch K1 to the pitch K2 is 3:1, for example, the pitch K1 is 630 nm and the pitch K2 is 210 nm. Sizes of the layout are not limited to the above example values. In one embodiment, the space S1 in FIG. 4 may correspond to the space S1 shown in FIG. 3. The space S1 may be, but not limited to, 35 nm to 42 nm.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a semiconductor structure, the shapes or positional relationship of the elements and the procedure details could be adjusted or changed according to the actual requirements and/or manufacturing steps of the practical applications.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    an electrode element having an upper surface, the upper surface comprising a plurality of convex curved portions arranged continuously; and
    a magnetic tunnel junction (MTJ) structure, wherein all of the plurality of convex curved portions overlaps with the magnetic tunnel junction structure in a vertical direction.

2. The semiconductor structure according to claim 1, wherein the electrode element comprises a lower electrode portion and an upper electrode portion on the lower electrode portion, wherein the upper electrode portion has the upper surface.

3. The semiconductor structure according to claim 2, wherein the upper electrode portion has a moth eye structure.

4. The semiconductor structure according to claim 2, wherein the upper electrode portion has a varied height, the lower electrode portion has a uniform height.

5. The semiconductor structure according to claim 1, wherein the plurality of convex curved portions has a hemisphere shape or a hemi-ellipsoid shape.

6. The semiconductor structure according to claim 1, wherein the electrode element is an electrode for the magnetic tunnel junction structure.

7. The semiconductor structure according to claim 1, wherein the electrode element is a top electrode for the magnetic tunnel junction structure.

8. The semiconductor structure according to claim 7, further comprising a bottom electrode, wherein the magnetic tunnel junction structure is electrically connected between the top electrode and the bottom electrode.

9. The semiconductor structure according to claim 7, further comprising a via element, wherein the magnetic tunnel junction structure is on the via element.

10. The semiconductor structure according to claim 9, further comprising a conductive layer, wherein the via element is on the conductive layer.

11. The semiconductor structure according to claim 10, wherein the conductive layer is a metal layer.

12. The semiconductor structure according to claim 9, further comprising a dielectric layer on a sidewall of the via element.

13. The semiconductor structure according to claim 12, further comprising a dielectric film on the dielectric layer, the magnetic tunnel junction structure and the electrode element.

14. The semiconductor structure according to claim 7, further comprising via elements separated from each other, wherein the magnetic tunnel junction structure is on the via elements.

15. The semiconductor structure according to claim 1, further comprising a hard mask layer on the electrode element.

16. The semiconductor structure according to claim 15, wherein the hard mask layer has a varied thickness.

17. The semiconductor structure according to claim 16, wherein the varied thickness has a profile gradually decreasing from a center of the hard mask layer toward two opposite sides of the hard mask layer.

18. The semiconductor structure according to claim 15, further comprising a dielectric film on the hard mask layer.

* * * * *